United States Patent
Bhandarkar et al.

(10) Patent No.: US 9,735,696 B2
(45) Date of Patent: Aug. 15, 2017

(54) FILTER CAPACITOR DEGRADATION AND CALIBRATION

(71) Applicant: Rockwell Automation Technologies, Inc., Mayfield Heights, OH (US)

(72) Inventors: Santosh M. Bhandarkar, Cedarburg, WI (US); Sinuhe Imuris Benitez Escobar, Mequon, WI (US); Nikhil Prasad, Milwaukee, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 11 days.

(21) Appl. No.: 14/951,531

(22) Filed: Nov. 25, 2015

(65) Prior Publication Data
US 2017/0149343 A1 May 25, 2017

(51) Int. Cl.
| | |
|---|---|
| *H02M 1/32* | (2007.01) |
| *H02M 1/14* | (2006.01) |
| *H02M 1/12* | (2006.01) |
| *H02M 5/456* | (2006.01) |
| *H02M 5/458* | (2006.01) |

(Continued)

(52) U.S. Cl.
CPC ............ *H02M 5/458* (2013.01); *H02M 1/08* (2013.01); *H02M 2001/0009* (2013.01)

(58) Field of Classification Search
CPC ........ H02M 5/4585; H02M 1/32; H02M 1/14; H02M 5/456; H02M 5/458; H02M 1/12; H02M 1/126; G01R 31/028

See application file for complete search history.

(56) References Cited

U.S. PATENT DOCUMENTS

| | | |
|---|---|---|
| 4,419,621 A | 12/1983 | Becker |
| 4,721,916 A | 1/1988 | Hanasawa |

(Continued)

FOREIGN PATENT DOCUMENTS

| | | |
|---|---|---|
| CN | 201393056 Y | 1/2010 |
| EP | 2299568 A1 | 3/2011 |

(Continued)

OTHER PUBLICATIONS

Bhattacharya, "Basic Electrical and Electronics Engineering", Aug. 18, 2011, 10 pgs.

(Continued)

*Primary Examiner* — Yemane Mehari
*Assistant Examiner* — Sisay G Tiku
(74) *Attorney, Agent, or Firm* — Fay Sharpe LLP

(57) ABSTRACT

Methods and power conversion systems in which a capacitor degradation detection system includes an adjustable gain amplifier circuit is calibrated by automatic adjustment of at least one amplifier gain to accommodate current and voltage levels of a particular filter circuit in a first mode. Capacitance values of filter capacitors are calculated according to amplified current signals and compared with an acceptable tolerance range to selectively identify a filter capacitor fault or to store calculated capacitance values as base values in an electronic memory in the first mode. During operation in a second mode with the rectifier and inverter on, the adjusted amplifier gain is used to amplify current sensor signals and/or voltage signals, and capacitance values of the filter capacitors are used to selectively identify capacitor degradation.

17 Claims, 5 Drawing Sheets

(51) Int. Cl.
*G01R 31/02* (2006.01)
*H02M 1/08* (2006.01)
*H02M 1/00* (2006.01)

(56) References Cited

U.S. PATENT DOCUMENTS

| | | | |
|---|---|---|---|
| 5,319,513 | A | 6/1994 | Lowenstein et al. |
| 5,491,725 | A | 2/1996 | White |
| 5,796,258 | A | 8/1998 | Yang |
| 5,804,973 | A | 9/1998 | Sinohara |
| 6,166,929 | A | 12/2000 | Ma et al. |
| 6,269,010 | B1 | 7/2001 | Ma et al. |
| 6,366,483 | B1 | 4/2002 | Ma et al. |
| 6,525,951 | B1 | 2/2003 | Paice |
| 6,642,689 | B2 | 11/2003 | Ishida et al. |
| 6,667,866 | B1 | 12/2003 | LaPlace |
| 7,274,576 | B1 | 9/2007 | Zargari et al. |
| 7,309,973 | B2 | 12/2007 | Garza |
| 7,495,410 | B2 | 2/2009 | Zargari et al. |
| 7,495,938 | B2 | 2/2009 | Wu et al. |
| 7,511,976 | B2 | 3/2009 | Zargari et al. |
| 7,602,127 | B2 | 10/2009 | Coumou |
| 7,616,005 | B2 | 11/2009 | Kalyuzhny et al. |
| 7,683,568 | B2 | 3/2010 | Pande et al. |
| 7,764,523 | B2 | 7/2010 | Conticelli et al. |
| 7,782,009 | B2 | 8/2010 | Wiseman |
| 7,786,735 | B2 | 8/2010 | Kalyuzhny et al. |
| 7,800,348 | B2 | 9/2010 | Zargari |
| 7,812,615 | B2 | 10/2010 | Gajic et al. |
| 7,818,137 | B2 | 10/2010 | Agarwal |
| 7,990,097 | B2 | 8/2011 | Cheng et al. |
| 8,009,450 | B2 | 8/2011 | Royak et al. |
| 8,030,791 | B2 | 10/2011 | Lang et al. |
| 8,044,631 | B2 | 10/2011 | Dai et al. |
| 8,183,874 | B2 | 5/2012 | Dommaschk |
| 8,259,426 | B2 | 9/2012 | Xiao et al. |
| 8,259,480 | B2 | 9/2012 | Hasler |
| 8,350,397 | B2 | 1/2013 | Lang et al. |
| 8,352,203 | B2 | 1/2013 | Seibel et al. |
| 8,395,910 | B2 | 3/2013 | Alexander |
| 8,400,800 | B2 | 3/2013 | Alexander |
| 8,587,160 | B2 | 11/2013 | Dai et al. |
| 8,643,383 | B2* | 2/2014 | Xiao ............... H02H 7/1203 318/445 |
| 8,648,610 | B2 | 2/2014 | Mikami |
| 8,693,229 | B2* | 4/2014 | Saeki ............... H02M 7/68 363/40 |
| 8,698,507 | B2 | 4/2014 | Huang |
| 8,729,844 | B2 | 5/2014 | Feng et al. |
| 8,937,796 | B2 | 1/2015 | Xiao et al. |
| 9,054,589 | B2 | 6/2015 | Cheng et al. |
| 2001/0017489 | A1 | 8/2001 | Inoue et al. |
| 2004/0257093 | A1 | 12/2004 | Sakiyama |
| 2006/0232471 | A1* | 10/2006 | Coumou ........... H01J 37/32082 342/450 |
| 2007/0211501 | A1* | 9/2007 | Zargari ............. H02M 5/4585 363/39 |
| 2009/0072982 | A1 | 3/2009 | Cheng et al. |
| 2009/0143034 | A1* | 6/2009 | Harpak ............. H04B 1/30 455/150.1 |
| 2009/0224771 | A1* | 9/2009 | Deveau ............. G01R 31/3658 324/600 |
| 2009/0310524 | A1* | 12/2009 | Katsube ............ H04L 7/041 370/311 |
| 2010/0097733 | A1 | 4/2010 | E. |
| 2010/0161259 | A1 | 6/2010 | Kim et al. |
| 2012/0271572 | A1 | 10/2012 | Xiao |
| 2013/0057297 | A1* | 3/2013 | Cheng ............... H02M 1/32 324/548 |
| 2013/0076151 | A1 | 3/2013 | Bae et al. |
| 2013/0106328 | A1* | 5/2013 | Kopiness ........... H02M 1/36 318/400.11 |
| 2013/0120038 | A1 | 5/2013 | Kerkman et al. |
| 2013/0120039 | A1 | 5/2013 | Kerkman et al. |
| 2013/0204560 | A1 | 8/2013 | Lo et al. |
| 2013/0279214 | A1* | 10/2013 | Takase ............... H02M 7/68 363/37 |
| 2013/0286692 | A1 | 10/2013 | Patel et al. |
| 2013/0289911 | A1* | 10/2013 | Patel ................. H02M 5/4585 702/65 |
| 2014/0012552 | A1 | 1/2014 | Zik |
| 2014/0217980 | A1 | 8/2014 | Malrieu |
| 2014/0320056 | A1 | 10/2014 | Royak |
| 2015/0092460 | A1 | 4/2015 | Tallam |
| 2015/0153397 | A1 | 6/2015 | Kerkman et al. |
| 2015/0155794 | A1 | 6/2015 | Long |
| 2015/0241503 | A1 | 8/2015 | Bhandarkar |
| 2015/0263600 | A1 | 9/2015 | Bhandarkar et al. |
| 2016/0126840 | A1* | 5/2016 | Kelly ................. H02M 1/08 323/271 |
| 2016/0173018 | A1* | 6/2016 | Nondahl ............ H02P 27/08 318/400.02 |

FOREIGN PATENT DOCUMENTS

| | | |
|---|---|---|
| EP | 2390997 A2 | 11/2011 |
| EP | 2660962 A2 | 11/2013 |
| FR | 2980053 | 3/2011 |
| WO | WO2012010353 A1 | 1/2012 |
| WO | WO 2012/044737 A2 | 4/2012 |
| WO | WO2012044737 A1 | 4/2012 |
| WO | WO2012110087 A1 | 8/2012 |
| WO | WO2012110088 A1 | 8/2012 |
| WO | WO 2013/038098 | 3/2013 |

OTHER PUBLICATIONS

"iCP-630 Capacitor Bank Protection Relay", Cooper Power Systems, Mar. 2007.
"Low Cost Low Power Instrumentation Amplifier", AD620; Analog Devices, Inc., Norwood, MA; 21 pgs.; Jan. 8, 2014.
"Protective Relays", iCP-630 Capacitor Bank Protection Relay, Cooper Power Systems, Jan. 2011, pp. 1-8.
ABB Bay Control REC670 Application manual, Relion 670 series, http://www05./abb.com/global/scot/scot354.nsf, Oct. 10, 2011, pp. 1-586 (2 parts).
ABB Distribution Automation Handbook, Section 8.10 Protection of Capacitor Banks, Mar. 5, 2011.
GE C70 Capacitor Bank Protection and Control System UR Series Instruction Manual C70 Revision: 6.0x, Copyright @ 2011, GE Multilin, http://www.GEmultilin.com, pp. 1-644 (2 parts).
Rodriguez-Valdez, et al., "Phase Locked Loop for Unbalanced Utility Conditions", 2010 Applied Power Electronics Conference and Exposition (APEC), 2010 25$^{th}$ Annual IEEE 2010, Piscataway, NJ, Feb. 21, 2010, pp. 634-641.
Transformer protection RET670 ANSI Application manual, Relion 670 series, http://www.abb.com/product/db0003db004281/c12573e700330419c/257f000263ad5.aspx#!, May 6, 2011, pp. 1-864 (2 parts).
U.S. Appl. No. 13/872,177, filed Apr. 29, 2013.
U.S. Appl. No. 14/042,753, filed Oct. 1, 2013.
U.S. Appl. No. 14/095,169, filed Dec. 3, 2013.
U.S. Appl. No. 14/187,972, filed Feb. 24, 2014.
U.S. Appl. No. 14/204,317, filed Mar. 11, 2014.
U.S. Appl. No. 14/296,836, filed Jun. 5, 2014.
U.S. Appl. No. 13/570,781, filed Aug. 9, 2012.
Lee, et al., "Online capacitance estimation of DC-link electrolytic capacitors for three-phase AC/DC/AC PWM converters using recursive least squares method", IEE Proc.-Electr. Power Appl., vol. 152, No. 6, Nov. 2005.
European Search Report and Written Opinion of corresponding European Application No. 16200379.2-1568 dated May 2, 2017, 9 pgs.

* cited by examiner

FILTER CAPACITOR DEGRADATION AND CALIBRATION

BACKGROUND INFORMATION

The disclosed subject matter relates to power conversion, and more specifically to apparatus and techniques for measuring filter circuit currents and detecting degraded filter capacitors.

BRIEF DESCRIPTION

Various aspects of the present disclosure are now summarized to facilitate a basic understanding of the disclosure, wherein this summary is not an extensive overview of the disclosure, and is intended neither to identify certain elements of the disclosure, nor to delineate the scope thereof. The primary purpose of this summary is instead to present various concepts of the disclosure in a simplified form prior to the more detailed description that is presented hereinafter. Disclosed examples include methods and power conversion systems in which an amplifier gain is calibrated through automatic adjustment to accommodate current levels of a particular filter circuit. Filter capacitor values are calculated according to amplified current signals and compared with an acceptable tolerance range to selectively identify a filter capacitor fault or to store the calculated capacitance values as base values in an electronic memory. During normal operation with the rectifier and inverter on, the adjusted amplifier gain is used to amplify current sensor signals, and capacitance values of the filter capacitors are used to selectively identify capacitor degradation.

BRIEF DESCRIPTION OF THE DRAWINGS

The following description and drawings set forth certain illustrative implementations of the disclosure in detail, which are indicative of one or more exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings.

DETAILED DESCRIPTION

Referring now to the figures, one or more embodiments or implementations are hereinafter described in conjunction with the drawings, wherein the various features are not necessarily drawn to scale. Motor drives and other power converters, particularly those with active front end (AFE) rectifiers, include an input filter circuit between the rectifier and the AC input source to reduce switching noise (e.g., total harmonic distortion or THD) associated with operation of the power converter. Many different input filter topologies exist, including inductance-capacitance (L-C) or inductance-capacitance-inductance (L-C-L) input filter circuits individually associated with each AC input phase. The filter capacitors may be subject to damage or degradation, which can be costly in terms of replacement component costs, labor for inspection and replacement, as well as downtime for the power converter and any associated machinery to manually identify and replace one or more degraded capacitors, and capacitor degradation may not be identifiable through simple visual inspection. Fuses may be placed in line with the filter circuit capacitors, but the fuses may not open quickly enough to prevent capacitor degradation or may open frequently in normal operation with healthy capacitors, leading to excessive system downtime and further costs for inspection and system verification.

Figure 1:
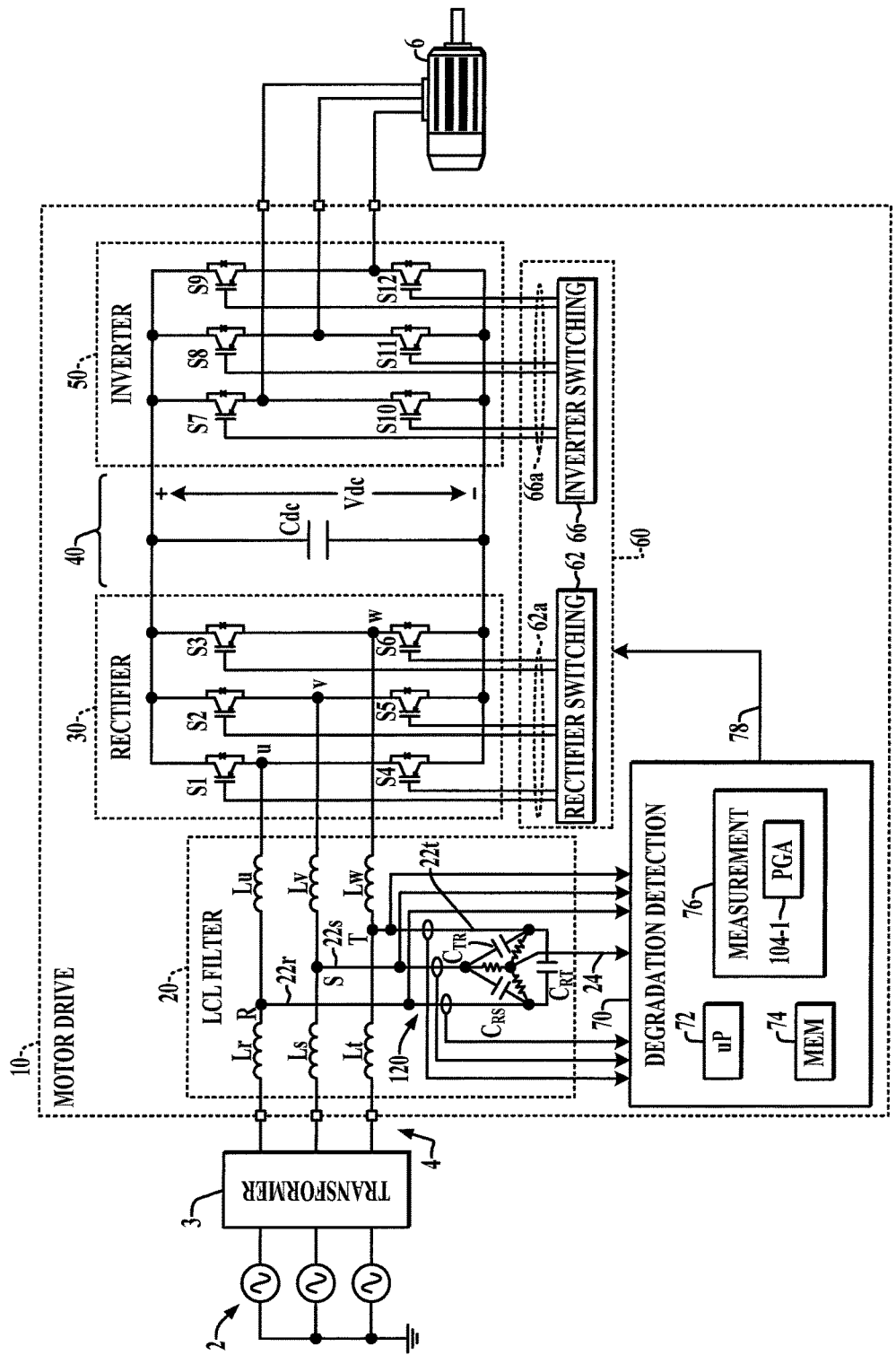
FIG. 1 is a schematic diagram illustrating a motor drive with an input LCL filter having delta-connected filter capacitors and filter capacitor degradation detection apparatus with a measurement circuit and programmable gain amplifiers.
Figure 2:
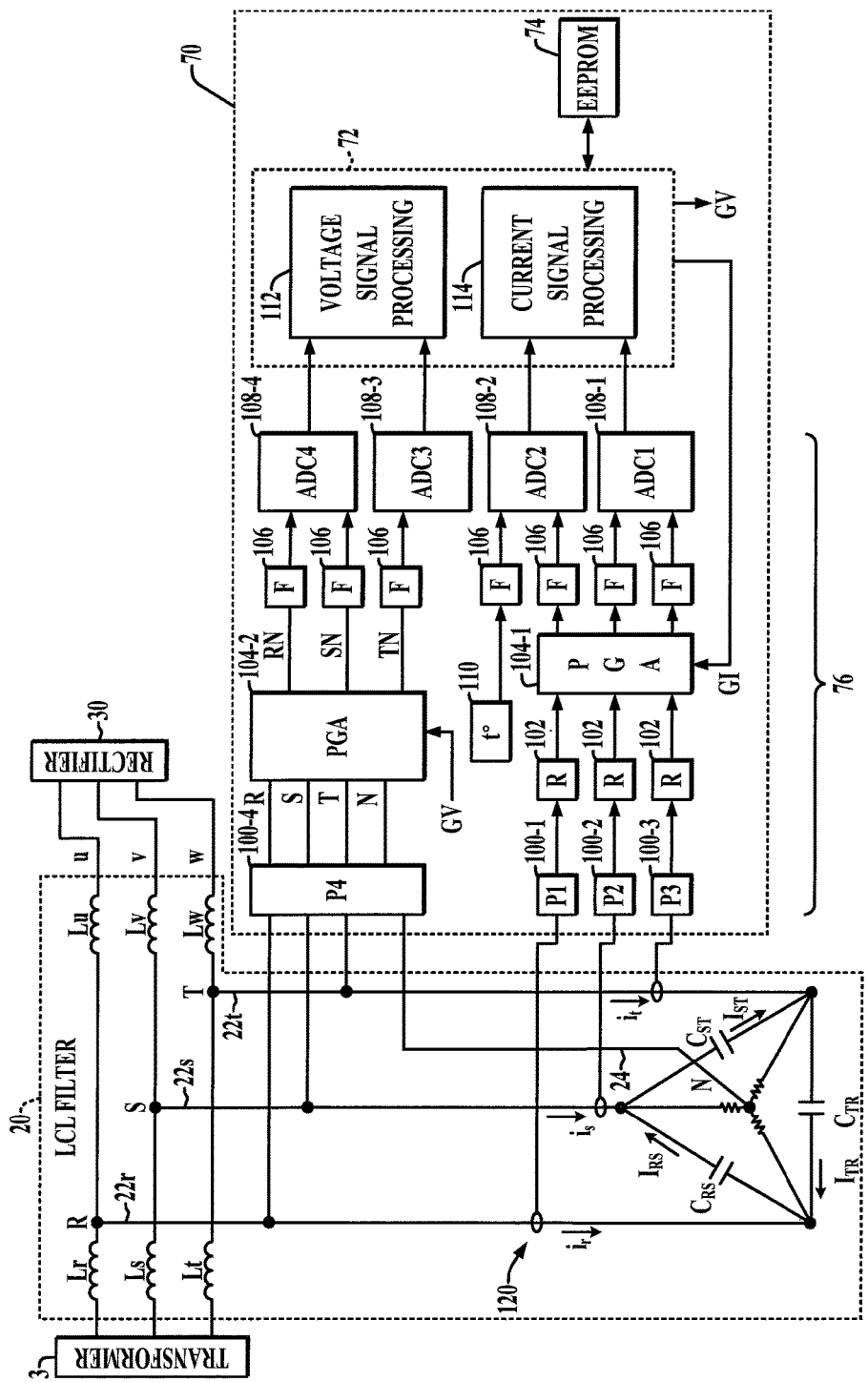
FIG. 2 is a partial schematic diagram illustrating further details of the degradation detection system and measurement system in the motor drive of FIG. 1.

FIGS. 1 and 2 illustrate an active front end motor drive example 10 with a degradation detection system 70 including a measurement system or circuit 76 including one or more programmable gain amplifiers (PGAs) 104-1. The measurement system 76 is operated by a processor 72 and an associated electronic memory 74 to obtain voltage and current values for detecting capacitor degradation and for other control purposes and operating the motor drive 10. The processor 72 in certain embodiments performs selective adjustment of the gain value of one or more programmable gain amplifiers 104-1 as explained further below. The present disclosure provides filter capacitor degradation identification solutions and measurement system adjustment embodiments finding utility in power conversion systems such as active front end motor drives. Although illustrated in the context of three-phase systems, the disclosed concepts can be employed in power converters having any number of input phases in which a filter includes a capacitor circuit or capacitor bank with capacitor components subject to degradation. In addition, the measurement systems are auto adaptive with respect to power levels of the converter, and can therefore be used in a variety of power converter models. The degradation detection, moreover, can be used to initiate any appropriate remedial or reporting action.

The motor drive 10 in FIG. 1 includes a three phase AC input 4 receiving input power from a three-phase source 2 via an optional transformer 3, as well as a rectifier 30, an intermediate DC link circuit 40 and an output inverter 50 providing variable frequency, variable amplitude AC output power to drive a motor or other load 6. Although illustrated and described in the context of a motor drive 10, the various disclosed concepts can be employed in other forms of power converters, whether providing an AC output or a DC output to drive a motor or other type of load 6. The drive input 4 includes three input phase terminals connected through an LCL input filter circuit 20 to the AC input of the switching (e.g., active front end) rectifier 30. Although the filter circuit 20 in FIGS. 1 and 2 is an "L-C-L" filter having two inductors in each series circuit path between the input 4 and the rectifier 30, the various concepts of the present disclosure can be employed in connection with other filter circuit topologies including without limitation L-C filters, C-L filters, etc. In the illustrated example of FIGS. 1 and 2, the filter circuit 20 includes a set or bank of three capacitors $C_{RS}$, $C_{ST}$ and $C_{TR}$ connected in a delta configuration, along with bleeding or discharge resistors connected between the capacitor terminals and a designated neutral node 24. In operation, capacitors $C_{RS}$, $C_{ST}$ and $C_{TR}$ are discharged upon system shutdown through conduction of discharge currents through the discharge resistors to the designated neutral node 24. Other implementations of the disclosed concepts and apparatus can be used in systems in which the capacitor bank is configured in a "Y" configuration. The individual capacitors of the filter circuit 20 can be constructed using single capacitor components, or may be individually constructed as series and/or parallel combinations of multiple capacitive components in various embodiments, and are hereinafter collectively termed "filter capacitors".

The measurement system 76 is advantageously automatically self-adaptive for use in connection with a variety of different associated filter circuits 20 having different capacitor values. In this regard, the system should is operated by the processor 72 in a first mode, referred to herein as "CALIBRATE" mode in which currents and voltages are measured in order to calculate capacitance values of the filter capacitors, and to compare these with predetermined value ranges stored in the processor memory 74. This allows the processor 72 to determine the nature and parameters of a connected filter 20, as well as to identify any potential capacitor degradation in the filter circuit 20 prior to entering a second or "NORMAL" mode of operation in which the rectifier 30 and the inverter 50 are turned on. Additionally, the measurement system 76 operates in conjunction with the processor 72 in the CALIBRATE mode receive and amplify current sensor signals representing the currents flowing in the filter circuit 20, and to selectively adjust gain values GI of the PGAs 104-1. In certain examples, the processor 72 also selectively adjusts voltage amplifier gain values GV to accommodate a conversion range of the corresponding analog to digital converter circuits based on amplified voltage signals. These features make the system 76 universally applicable to conversion systems 10 operating at a variety of different power levels. Moreover, the use of the algorithm of the present disclosure automates testing of the filter and of the detection hardware independent of the input voltage and frequency.

As seen in FIG. 1, the illustrated switching rectifier 30 is an active front end converter with switching devices S1-S6 individually coupled between a corresponding AC input phase (u, v, or w) and a corresponding DC bus terminal (+ or −) of the DC link circuit 40. A drive controller 60 includes a rectifier switching controller 62 that selectively provides rectifier switching control signals 62a in the second mode NORMAL to the individual rectifier switches S1-S6 to cause the rectifier 30 to convert received three-phase AC input power to provide a DC voltage Vdc across a DC bus capacitance Cdc of the link circuit 40 using any suitable pulse width modulation (PWM) technique. Other embodiments are possible, for example, using a passive rectifier circuitry 30 in conjunction with a filter circuit 20. In the first mode (CALIBRATE), the drive 10 is powered and the switches S1-S6 are turned off by the controller 60 in one example. In another example, the drive 10 is powered on and the rectifier 30 is turned on during the CALIBRATE mode, with various measurements and adjustments being performed during precharging of the DC link capacitor Cdc. In another example, the inverter 50 can be turned on or off during the CALIBRATE mode.

The inverter 50 receives DC input power from the link circuit 40 and includes inverter switches S7-S12 individually coupled between one of the positive or negative DC bus terminals and a corresponding output phase connected to drive the motor load 6. The inverter switches S7-S12 are operated in the NORMAL second mode according to inverter switching control signals 66a provided by an inverter switching component 66 of the drive controller 60, which generates the signals 66a according to any suitable pulse width modulation technique to convert DC power from the link circuit 40 to provide variable frequency, variable amplitude AC output power to drive the motor load 6. In the first or CALIBRATE mode, the controller 60 turns off the inverter switches S7-S12 in one example. In another example, the inverter 50 can be turned on during the CALIBRATE mode. The Any suitable form of switching devices S1-S12 can be used, including without limitation insulated gate bipolar transistors (IGBTs), silicon controlled rectifiers (SCRs), gate turn-off thyristors (GTOs), integrated gate commutated thyristors (IGCTs), etc. The controller 60 can be any suitable hardware, processor-executed software, processor-executed firmware, programmable logic, analog circuitry, etc. or combinations thereof which provides control signals 62a, 66a for operating the rectifier 30 and the inverter 50, and may implement other functionality associated with operation of the motor drive 10. While the illustrated embodiment includes a switching inverter 50 and associated controller 66, other power converter configurations or embodiments are possible in which the DC power delivered by the rectifier 30 to the bus circuit 40 is provided as an output, wherein the inverter 50 and inverter switching controller 66 may be omitted.

The filter circuit 20 in FIGS. 1 and 2 includes three series circuits individually connected between the power converter input 4 and the corresponding phase of the rectifier AC input. Each series circuit includes a pair of series-connected filter inductors, with the first circuit including inductor Lr connected between the first power converter input terminal and a first intermediate node "R", as well as a second filter inductor Lu connected between the intermediate node R and a first rectifier AC input node "u". Similarly, the second series circuit includes a first inductor Ls connected between the second motor drive input and a second intermediate node "S" and a second inductor Lv connected between the node S and the second rectifier input "v", as well as a third series circuit with first and second inductors Lt and Lw joined by a third intermediate node "T". In addition, the filter circuit 20 includes three capacitor circuit branches 22r, 22s and 22t respectively connecting the nodes R, S and T to a delta configuration of three filter capacitors $C_{RS}$, $C_{ST}$ and $C_{TR}$. In this delta-connected capacitor circuit, each filter capacitor is connected to two of the capacitor circuit branches 22 (e.g., line-to-line) as shown. Other non-limiting embodiments are possible in which a CL filter circuit 20 is provided (not shown) for interfacing the motor drive 10 with the power source 2, directly or through a transformer 3, for instance, with the first filter inductors Lr, Ls and Lt omitted due to the inductance of the secondary windings of the transformer 3, and with the input terminals 4 and the capacitor circuit branches 22r, 22s and 22t being connected directly to the inductors Lu, Lv and Lw at the nodes R, S and T, respectively.

The degradation detection apparatus or system 70 is operatively coupled with the filter circuit 20. The measurement circuit 76 in the detection system 70 senses or otherwise measures line-to-neutral voltages $V_{rn}$, $V_{sn}$ and $V_{tn}$, for example, by sensing the voltages at the branch circuits 22 relative to the designated neutral node 24 connecting the capacitor bank bleed resistors as illustrated. In certain embodiments, the measurement circuitry 76 need only measure two of the three line-to-designated neutral voltages, in this case $V_{rn}$ and $V_{sn}$, with the remaining line-neutral voltage $V_{tn}$ being computed based on the two measured voltage values corresponding to $V_{rn}$ and $V_{sn}$. It is also possible to measure line-line voltages $V_{rs}$, $V_{st}$ and $V_{tr}$ using a differential amplifier, and/or to compute the line-line voltages using the processor 72 from the line-neutral measurements. In addition, the measurement circuitry 76 includes or is connected to current sensors 120 coupled to the branch circuits 22 to sense the filter circuit branch currents $I_r$, $I_s$ and $I_t$ flowing in the associated capacitor circuit branches 22r, 22s and 22t, respectively.

The degradation detection system 70 includes the microprocessor element 72 along with the electronic memory 74, and the degradation detection system 70 and other embodiments can be any suitable hardware, processor-executed software, processor-executed firmware, programmable logic, analog circuitry, etc. or combinations thereof which provides the described capacitor degradation detection and calibration functionality. In various implementations, the degradation detection system 70 may include filtering, RMS computations, power computations, frequency computations and/or threshold comparison functionality, one or more of which functions may be implemented using one or more processor elements 72 executing computer executable instructions stored in the electronic memory 74.

Certain features of the illustrated measurement system example 70 are implemented in hardware measurement circuitry 76 including circuits 100, 102, 104, 106, 108 and 110. The processor 72 receives digital values from analog to digital converters (ADCs) 108 to implement voltage signal processing functions 112 and current signal processing functions 114 as shown in FIG. 2. As shown in FIG. 1, the degradation detection system 70 in certain implementations provides one or more output signals or values 78 to identify a detected filter capacitor degradation condition in the filter circuit 20, and the signals or values 78 may include or otherwise provide an identification of a suspected degrading or degraded filter capacitor $C_{RS}$, $C_{ST}$ and/or $C_{TR}$ of the filter circuit 20 In one example the degradation detection signal(s) or value(s) 78 are provided to the motor drive controller 60 to initiate one or more actions, such as shutting down the motor drive 10 and/or providing an alert or warning signal or other indication, for instance, to a user interface associated with the motor drive 10 and/or to a connected network (not shown).

As best seen in FIG. 2, the illustrated measurement circuitry 76 can be implemented as a circuit board which can be installed in a motor drive 10, with circuit board connections 100-1, 100-2, 100-3 and 100-4 respectively labeled P1, P2, P3 and P4 allowing electrical connection to the filter circuit 20. In this example, connector 100-4 provides for signals associated with the R, S, T and neutral (N) nodes of the filter circuit 22 a programmable gain amplifier (PGA) 104-2, which provides amplified line-neutral voltage signals RN, SN and TN to corresponding low pass filter circuits 106 according to a voltage gain signal or value GV provided by the processor 72. The filtered line-neutral voltage signals are converted to digital form by single or dual channel analog to digital converter circuits 108-4 and 108-3 (ADC4 and ADC3), and digital line-neutral voltage values are provided to the voltage signal processing function 112 implemented by the processor 72.

In certain embodiments, the processor 72 selectively adjusts the voltage gain signal or value GV according to a conversion range of the analog to digital converter circuits 108-3 and/or 108-4 shown in FIG. 2. This feature advantageously allows flexible application in conversion systems 10 that can accommodate a wide variety of input voltage levels. For example, the filter voltages in different end use applications may be at different levels, such as 400 V, 480 V, 600 V and 690 V. In one possible implementation, the programmable gain amplifier 104-2 receives the voltage signals from the connector 100-4 through a resistor divider circuit (not shown) to reduce the input signal level for example from 690 V to a 5 V level corresponding to the input range (e.g., 5 V) of the analog to digital converters 108-3, 108-4. In the CALIBRATE mode, the processor 72 in certain examples amplifies the voltage sensor signals representing the filter voltages to generate amplified voltage signals, and converts the amplified voltage signals using the analog to digital converter circuit or circuits 108-3, 108-4. Based on these converted values, the processor 72 selectively adjusts the second amplifier gain of GV of the second PGA circuit 104-2 according to the conversion range of the analog to digital converter circuit or circuits 108-3, 108-4. In this manner, the measurement circuitry 76 automatically adapts itself from a default voltage PGA gain GV of 1.0 (unity) and selectively increases the gain GV if necessary to best use the conversion range of the converter circuits 108-3, 108-4.

Figure 3:
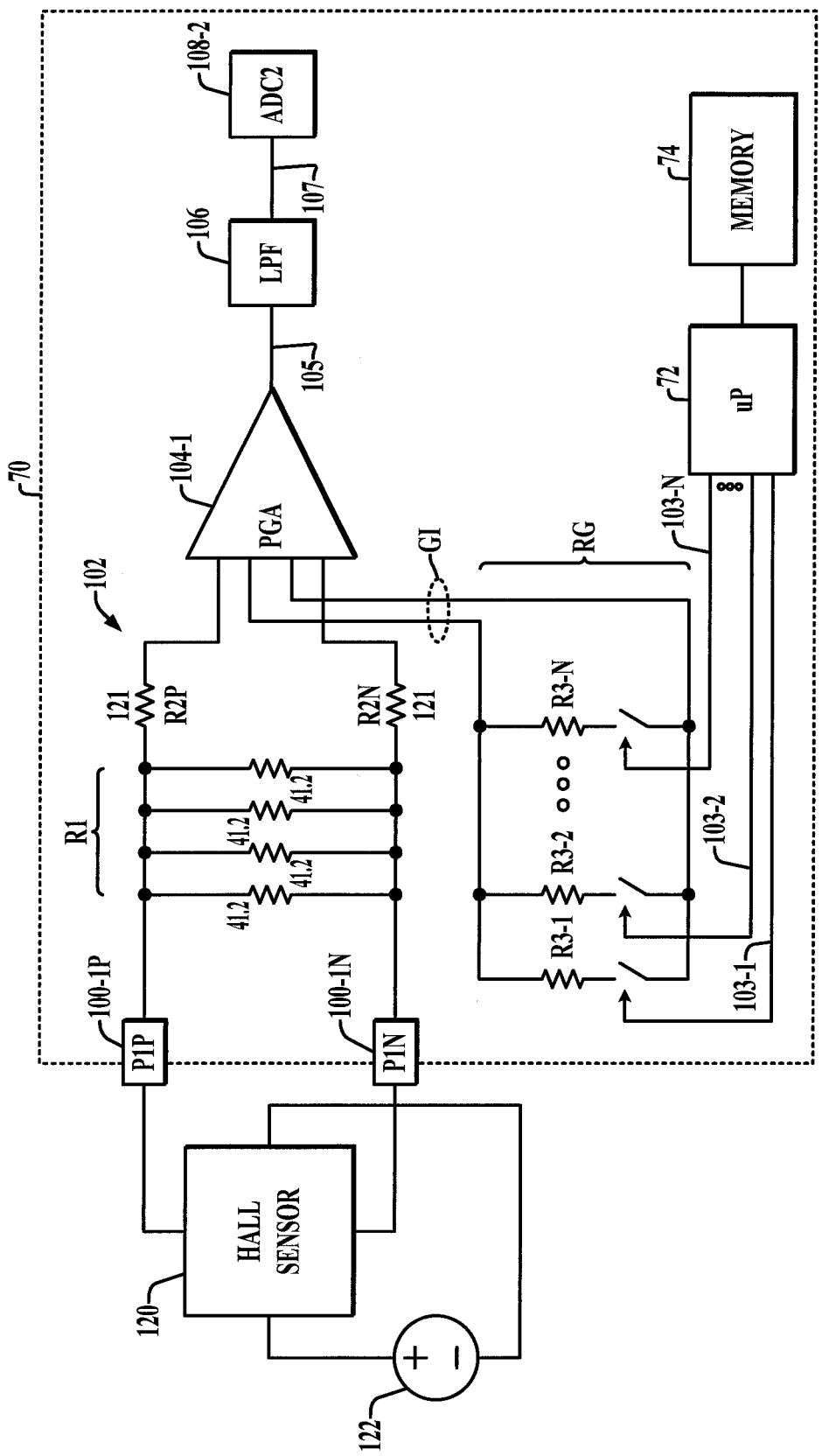
FIG. 3 is a partial schematic diagram illustrating programmable gain amplifier circuitry in the measurement system of FIGS. 1 and 2.

The measurement circuitry 76 further includes current signal processing components, with the connectors 100-1, 100-2 and 100-3 each providing electrical connection to corresponding Hall sensors or other current sensors 120 of the filter circuit 20. In one example, as shown further in FIG. 3 below, Hall sensors 120 are used to sense the filter currents $i_R$, $i_S$, and $i_T$, and differential Hall sensor current sensor signals are provided via each connector 100-1, 100-2 and 100-32 burden resistor circuits 102 for each of the filter circuit branches 22. The burden resistors 102 in FIG. 2 can individually include multiple resistors, for example, as shown in FIG. 3 below. Signals from the burden resistor circuits 102 are provided to a programmable gain amplifier circuit 104-1, which can include individual PGA circuits for each branch current as shown in FIG. 3 in one example. The PGA 104-1 amplifies the current sensor signals according to a current gain value GI provided by the processor 72, and provides amplified signals to low pass filter circuits 106, which in turn provide filtered current sensor signals to ADC circuits 108-1 and 108-2. In addition, the filter circuit 20 can include a temperature sensor (not shown) providing a temperature signal 110 (t°) to a filter circuit 106 that provides an input to the ADC 108-2 for monitoring of filter circuit temperature by the processor 72.

FIG. 3 shows an example programmable gain amplifier circuit 104-1 and burden resistor circuit 102 which can be used in the measurement circuit 76 of FIGS. 1 and 2. In this example, a Hall sensor 120 is disposed near a corresponding filter circuit branch 22 (FIGS. 1 and 2) and is energized by a DC voltage source 122. Output lines from the sensor 120 provide a differential current sensor signal via positive and negative connectors P1P (100-1P) and P1N (100-1N) to the resistor circuit 102. The burden resistor circuit 102 in this example includes one or more parallel resistors collectively designated R1 and series resistors R2P and R2N. The parallel resistance R1 in one example includes four 41.2Ω resistors in parallel as shown, although other values and numbers of parallel resistors or a single resistor R1 can be used. Series resistors R2P and R2N are each 121Ω in one example, although other values can be used.

A differential input signal is provided from the series resistors R2P and R2N to first and second input terminals of a programmable amplifier integrated circuit 104-1 in the example of FIG. 3, which provides a single ended or differential output 105 representing the received current sense signal amplified by a current amplifier gain GI. In one example, the PGA 104-1 includes a differential amplifier integrated circuit (IC), such as an Analog Devices AD620, having a programmable or adjustable gain GI, for each of the sensed filter branch currents. In the example of FIG. 3, the gain GI is set by a gain resistance circuit labeled RG, which is a programmable resistance circuit including an integer number N gain adjustment resistors R3-1, R3-2, . . . , R3-N, where N Is Greater Than 1. Each of the resistances R3 in this example is connected in series with a corresponding switch, controlled by switch control signal lines 103-1, 103-2, . . . , 103-N according to signals from the processor 72. In this manner, the processor 72 can set or adjust the gain of the PGA 104-1. Other programmable gain amplifier configurations can be used. In the illustrated example, the processor 72 switches the circuit RG using the signals 103 in order to set the resistance between the gain adjustment input terminals of the PGA 104-1. In one example, the gain is set according to the resistance RG according to the following values:

| RG (Ω) | Gain |
|---|---|
| 49.9k | 1.990 |
| 12.4k | 4.984 |
| 5.49k | 9.998 |
| 2.61k | 19.93 |
| 1.00k | 50.40 |
| 499 | 100.0 |
| 249 | 199.4 |
| 100 | 495.0 |
| 49.9 | 991.0 |

The PGA 104-1 amplifies the current sensor signal representing the associated filter current and generates a corresponding amplified current signal 105. In one example, the amplified current signal 105 is provided to a low pass filter circuit 106. In one possible implementation, the low pass filter circuit 106 has a cutoff frequency above the operating frequency of the system 10. For example, a cutoff frequency of approximately 200 Hz can be used for a motor drive system 10 operating from a 50 Hz or 60 Hz supply in one non-limiting embodiment. The filter circuit 106 provides an output 107 for conversion by the analog to digital converter circuit 108-2. Although FIG. 3 illustrates a detailed example of burden resistor circuitry 102 and programmable gain amplifier 104-1 and associated gain adjustment circuitry RG, 103 for a single current input channel, similar circuitry is provided for the other current channels in the measurement circuit 76. In certain embodiments, the PGA 104-2 used for amplifying the voltage signals is constructed in similar fashion to the example of FIG. 3, with a resistive divider network (not shown) substituted for the burden resistor circuit 102 to provide a divided voltage signal to a PGA stage having a gain resistor circuit RG with switch is controlled by the processor 72 as described above in connection with the current measurements. In this manner, the processor 72 can selectively adjust the gain of the PGA 104-2 in FIG. 2 in order to selectively set the signal range to best use the input range of the corresponding analog to digital converter circuit or circuits 108-3, 108-4 to obtain the voltage measurements.

Figure 4A:
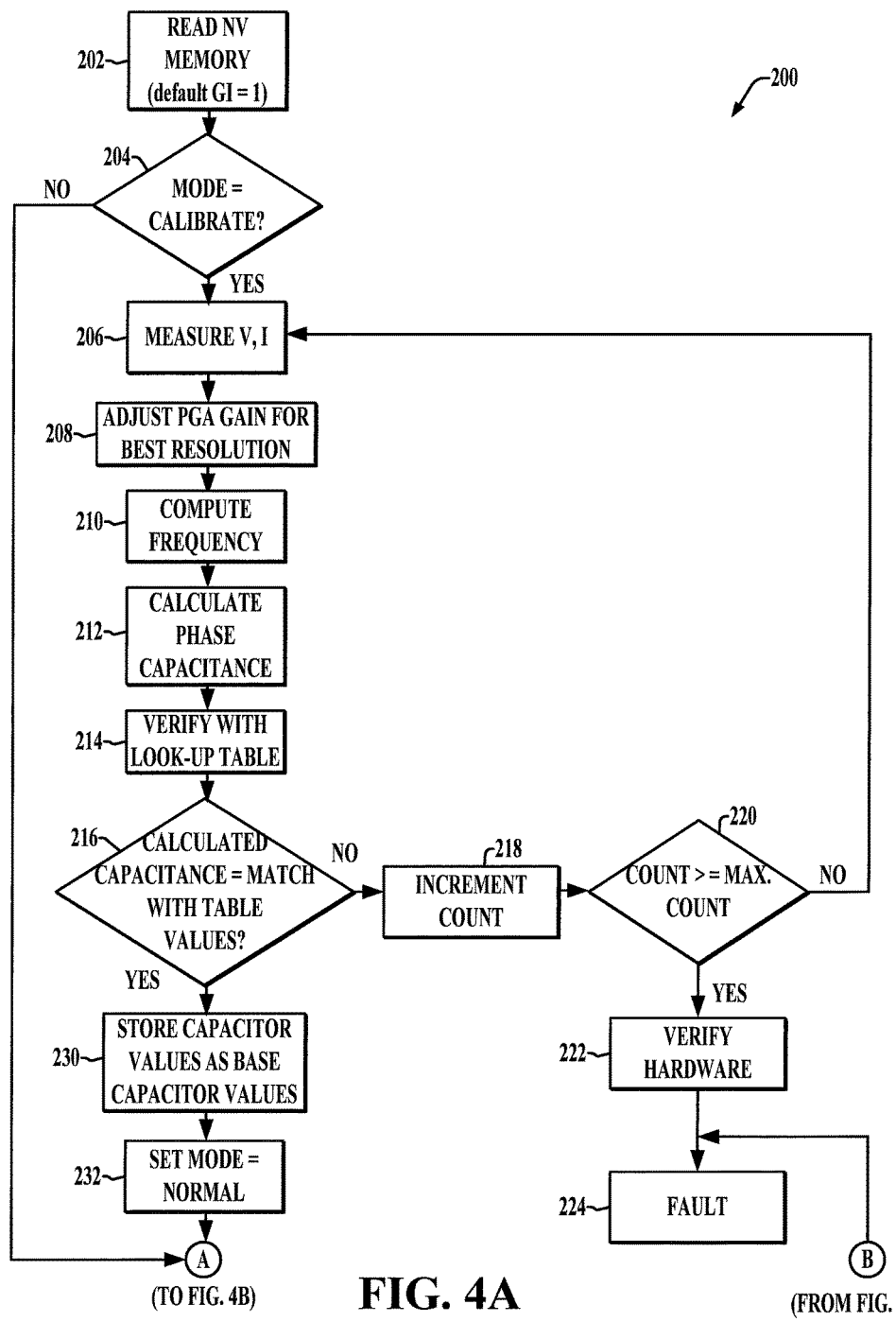
FIGS. 4A and 4B provide a flow diagram illustrating a filter capacitor degradation detection and calibration process.
Figure 4B:
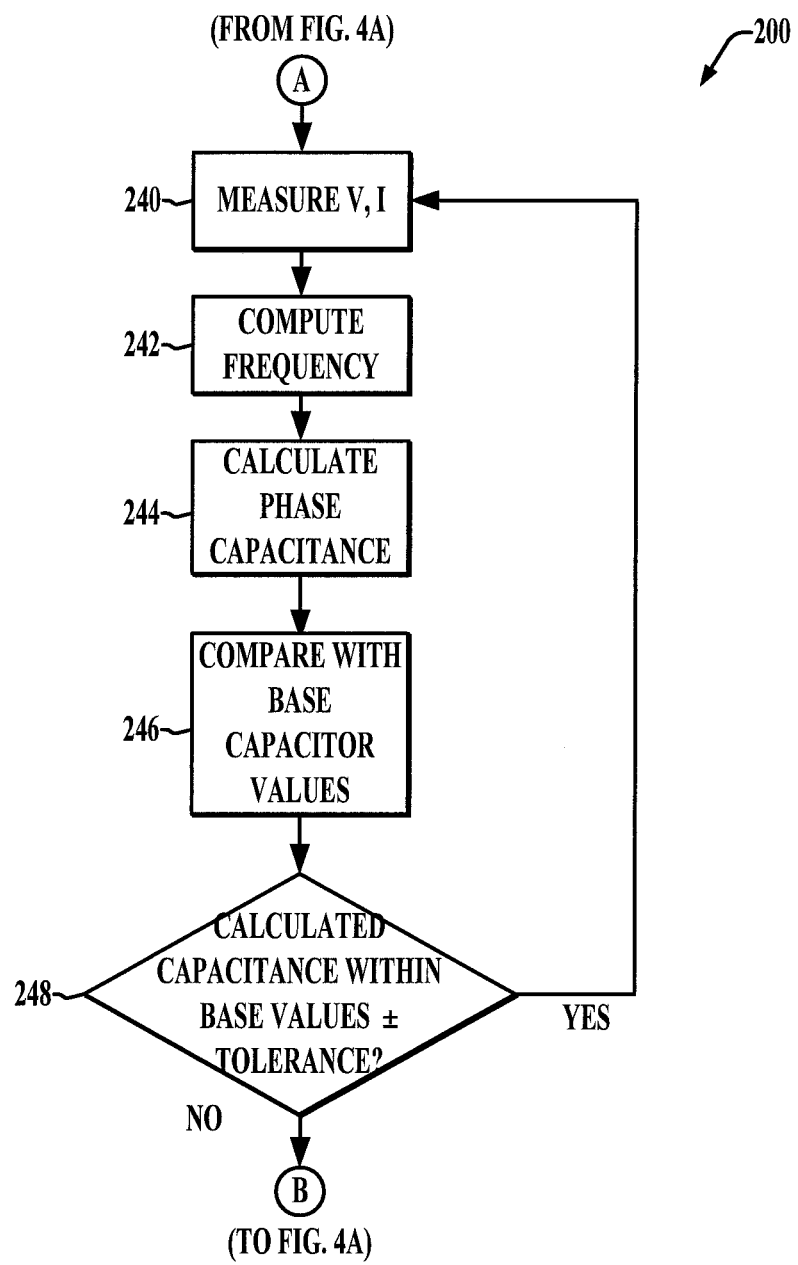

Referring also to FIG. 4A and FIG. 4B, a process or method 200 is illustrated for calibrating a measurement circuit 76 of a degradation detection system 70 in the motor drive 10, and for detecting filter capacitor degradation in the system 10. While the method 200 is illustrated and described as a series of acts or events, the methods of the present disclosure are not limited by the illustrated ordering of such acts or events except as specifically set forth herein. Except as specifically provided hereinafter, some acts or events may occur in different order and/or concurrently with other acts or events apart from those illustrated and described herein, and not all illustrated steps may be required to implement a process or method in accordance with the present disclosure. The illustrated methods may be implemented in hardware, processor-executed software or processor-executed firmware, or combinations thereof, and various embodiments or implementations include non-transitory computer readable mediums having computer-executable instructions for performing the illustrated and described methods. For example, the method 200 may be implemented by using the measurement circuitry 76 and a processor 72 as described herein according to program instructions for calibration and filter capacitor degradation detection or identification, with various instructions and data being stored in the electronic memory 74 associated with the processor 72, although the method 200 can be implemented in other systems, including without limitation those illustrated and described herein.

Beginning in FIG. 4A, the processor 72 and hence the system 10 are initially operated in one of two modes according to a value stored in nonvolatile memory (e.g., EEPROM memory 74 in FIGS. 1 and 2). At 202, the processor 72 reads the memory 74 to ascertain whether the system 10 has previously been commissioned and calibrated, and to obtain a current setting for the current amplifier gain of GI (e.g., the default value GI=1 for unity gain in one example). At 204 in FIG. 4A, the processor 72 determines whether the system mode is to be set to a first mode "CALIBRATE". For example, if the system has not previously been commissioned or calibrated, the memory 74 will include a flag or value indicating this, and the processor 72 will accordingly set the mode at 204 to the first mode CALIBRATE (YES at 204). Otherwise (NO at 204), the process 200 proceeds to operation in a second "NORMAL" mode illustrated and described below in connection with FIG. 4B.

Calibration operation in FIG. 4A begins at 206 in the first mode with the drive 10 powered where the rectifier 30 and/or the inverter 50 may be powered or maybe turned off, and filter voltages $v_{rn}$, $v_{sn}$ and $v_{tn}$ associated with the filter circuit 20 are measured. In addition, the amplifier circuit 104-1 is employed at 2062 amplify the current sensor signals representing the currents $i_r$, $i_s$ and $i_t$ associated with the filter circuit 20 to generate amplified current signals 105. Also at 206, the amplified current signals 105 are converted using the analog to digital converters 108-1 and 108-2 (FIG. 2 above), and the voltage signals are filtered and converted using analog to digital converters 108-3 and 108-4.

At 208 in FIG. 4A, the processor 72 automatically adjusts the amplifier gain GI of the amplifier circuit 104-1 according to a conversion range of the corresponding analog to digital converter circuit 108 based at least partially on the amplified current signals 105. In this manner, the measurement circuit 76 can accommodate a variety of different installed system operating parameters, such as current ratings. Based on the initial measurements at 206, the processor 72 in one example can determine whether a significant portion of the input signal range of the analog to digital converter 108 is used. In this manner, the adjustment at 208 can be used to selectively change the gain GI for a best match with the resolution of the converter 108. For example, using an initial default gain of 1, the processor 72 can determine whether the initial measurements of the filter currents at 206 are using only a small portion of the input range of the analog to digital converter 108, and if so, selectively increase the gain GI. For example, whereas a unity gain setting (GI=1) may be used in certain examples to accommodate a 400 amp system rating, a higher amplifier gain such as GI=2.5 or 3.0 will better accommodate a 250 amp rated system 10. The adjustment process at 208 may be iterative, including more than one measurement and adjustment steps. In certain examples, the processor 72 stores the adjusted amplifier gain value GI in the electronic memory 74 to allow operation at that setting thereafter when the motor drive 10 is again powered on.

The first mode (CALIBRATE) continues at 210, with the processor 76 evaluating the measured voltage and current signals, or otherwise measuring or computing or estimating the system operating frequency. For example, the system 10 may be used in locations having a 50 Hz line frequency associated with the source 2, or other installations may use 60 Hz power. At 212, the processor 72 computes or otherwise calculates estimated filter capacitance values based at least partially on the amplified current signals 105 and the measured filter voltages. In one example, the filter capacitance calculation at 212 also takes into account the computed or measured frequency obtained at 210. At 214, the processor 72 determines whether the calculated capacitance values are within an acceptable tolerance range. For example, the electronic memory 74 may include lookup tables including capacitance value ranges for a variety of different filter circuit configurations 20, each having different nominal capacitance values.

At 216, the processor 72 determines whether the capacitance values calculated at 212 are within an acceptable tolerance range (e.g., +/−10% or 20%) of any of the nominal capacitance values stored in the lookup table of the memory 74. If so (YES at 216), the processor 72 stores the calculated capacitor values as base values in the memory 74. The processor 72 may also adjust other control parameters used by the controller 60 based on the determination of the capacitance values of the capacitors in the connected filter circuit 20. Moreover, the calculated capacitance values can then be used as a baseline for assessing degradation of the filter capacitors during operation in the second or NORMAL mode as discussed further below in connection with FIG. 4B. In this case, the processor 72 sets the mode to NORMAL at 232, and the process 200 continues in FIG. 4B.

If the calculated capacitance values are not within the acceptable tolerance range (NO at 216 in FIG. 4A), the processor 72 selectively identifies filter capacitor faults in the conversion system 10 (e.g., including failures, discernible degrees of capacitor degradation, etc.) at 218 and 220. In this case, the processor 72 may increment a counter at 218 in certain examples, and determine whether the count has exceeded a maximum count value at 220. If the maximum, value has not been exceeded (NO at 220), the process 200 returns to again measure the operating parameters at 206-216 as described above. In this example, the filter voltages and current sensor signals are evaluated an integer number N times through use of the counter increment it at 218 and evaluated at 220, and the processor 72 identifies a filter capacitor fault if all the N calculated capacitance values are not within the acceptable tolerance range. This example implementation allows the system to avoid falsely identifying capacitor degradation, and falsely storing incorrect capacitor base values due to non-ideal measurement conditions during system startup. In other examples, the counter need not be used, and the processing at 218 and 220 can be omitted. Once a capacitor value is determined to be outside of an expected acceptable tolerance range (YES at 220), the processor may verify system hardware at 222, or may provide a flag or notification to a user to have service personnel verify the hardware of the power conversion system 10 at 222, and a fault is identified at 224.

Turning now to FIG. 4B, if the filter capacitors are determined to be within expected acceptable tolerance range is during the CALIBRATE mode, or if the system 10 has already been commissioned and calibrated (NO at 204 in FIG. 4A), the processor 72 operates the power conversion system 10 in a second mode "NORMAL" with the rectifier 30 and any included inverter 50 being turned on. At 240 in FIG. 4B, the voltage and current signals associated with the filter circuit 20 are measured by the processor 72 of the degradation detection system 70, similar to the measurements at 206 described above in one example. At 242, the frequency is again computed, and the processor 72 calculates phase capacitance values at 244 representing the estimated capacitance of the capacitors in the filter circuit 20. These calculated capacitor values are compared at 246 with the base capacitance values previously obtained and stored in the electronic memory 74 during the CALIBRATION mode. If the calculated capacitance values are within the base tolerance values and an acceptable tolerance range thereof parentheses YES at 248 in FIG. 4B), the processor continues operation in the second NORMAL mode at 240-248 as previously described. Otherwise (NO at 248), the process 200 returns to identify one or more capacitor faults at 224 in FIG. 4A.

The above examples are merely illustrative of several possible embodiments of various aspects of the present disclosure, wherein equivalent alterations and/or modifications will occur to others skilled in the art upon reading and understanding this specification and the annexed drawings. In particular regard to the various functions performed by the above described components (assemblies, devices, systems, circuits, and the like), the terms (including a reference to a "means") used to describe such components are intended to correspond, unless otherwise indicated, to any component, such as hardware, processor-executed software, or combinations thereof, which performs the specified function of the described component (i.e., that is functionally equivalent), even though not structurally equivalent to the disclosed structure which performs the function in the illustrated implementations of the disclosure. In addition, although a particular feature of the disclosure may have been disclosed with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising". This description uses examples to disclose various embodiments and also to enable any person skilled in the art to practice the disclosed subject matter, including making and using any devices or systems and performing any incorporated methods. It will be evident that various modifications and changes may be made, and additional embodiments may be implemented, without departing from the broader scope of the present disclosure as set forth in the following claims, wherein the specification and drawings are to be regarded in an illustrative rather than restrictive sense.

The following is claimed:

1. A method in a filter circuit of a power conversion system including a rectifier and an inverter, the method comprising, in a first mode with multiphase AC power provided to the filter circuit:

measuring filter voltages associated with the filter circuit;
using an amplifier circuit, amplifying current sensor signals representing filter currents associated with the filter circuit to generate amplified current signals;
converting the amplified current signals using an analog to digital converter circuit;
using a processor, automatically adjusting an amplifier gain of the amplifier circuit according to a conversion range of the analog to digital converter circuit based at least partially on the amplified current signals:
calculating capacitance values of filter capacitors of the filter circuit based at least partially on the amplified current signals and the measured filter voltages;
determining whether the calculated capacitance values are within an acceptable tolerance range;
if the calculated capacitance values are not within the acceptable tolerance range, selectively identifying a filter capacitor fault in the power conversion system; and
if the calculated capacitance values are within the acceptable tolerance range:
  storing the calculated capacitance values as base values in an electronic memory of the power conversion system, and
  changing to a second mode with the rectifier on and the inverter on.

2. The method of claim 1, wherein selectively identifying a filter capacitor fault includes:
measuring the filter voltages, amplifying the current sensor signals, and calculating the capacitance values an integer number N times, wherein N is greater than 1; and
identifying a filter capacitor fault if all the N calculated capacitance values are not within the acceptable tolerance range.

3. The method of claim 2, further comprising, in the second mode with the rectifier on and the inverter on:
measuring the filter voltages;
amplifying the current sensor signals using the adjustable amplifier circuit;
converting the amplified current signals using the analog to digital converter circuit;
calculating capacitance values of the filter capacitors based at least partially on the amplified current signals and the measured filter voltages;
determining whether the calculated capacitance values are within a second acceptable tolerance range; and
if the calculated capacitance values are not within the second acceptable tolerance range, selectively identifying a filter capacitor fault in the power conversion system.

4. The method of claim 3, wherein the second acceptable tolerance range is determined at least partially according to the base values stored in the electronic memory.

5. The method of claim 4, wherein the second acceptable tolerance range is determined at least partially according to the base values stored in the electronic memory.

6. The method of claim 1, further comprising, in the second mode with the rectifier on and the inverter on:
measuring the filter voltages;
amplifying the current sensor signals using the adjustable amplifier circuit;
converting the amplified current signals using the analog to digital converter circuit;
calculating capacitance values of the filter capacitors based at least partially on the amplified current signals and the measured filter voltages;
determining whether the calculated capacitance values are within a second acceptable tolerance range; and
if the calculated capacitance values are not within the second acceptable tolerance range, selectively identifying a filter capacitor fault in the power conversion system.

7. The method of claim 1, further comprising storing an adjusted amplifier gain value in the electronic memory.

8. The method of claim 1,
wherein measuring the filter voltages associated with the filter circuit comprises:
  using a second amplifier circuit, amplifying voltage sensor signals representing the filter voltages to generate amplified voltage signals;
  converting the amplified voltage signals using a second analog to digital converter circuit; and
  adjusting a second amplifier gain of the second amplifier according to a conversion range of the second analog to digital converter circuit based at least partially on the amplified voltage signals.

9. A power conversion system, comprising:
a rectifier providing a DC output;
a filter circuit coupled between a power converter input and the rectifier;
an inverter providing an AC output by converting the DC output of the rectifier;
an amplifier circuit to amplify current sensor signals representing filter currents associated with the filter circuit to generate amplified current signals;
an analog to digital converter circuit to convert the amplified current signals;
a processor operative, in a first mode to:
  measure filter voltages associated with the filter circuit, and
  automatically adjust an amplifier gain of the amplifier circuit according to a conversion range of the analog to digital converter circuit based at least partially on the amplified current signals,
  calculate capacitance values of filter capacitors of the filter circuit based at least partially on the amplified current signals and the measured filter voltages,
  determine whether the calculated capacitance values are within an acceptable tolerance range,
  if the calculated capacitance values are not within the acceptable tolerance range, selectively identify a filter capacitor fault in the power conversion system, and
  if the calculated capacitance values are within the acceptable tolerance range:
    store the calculated capacitance values as base values in an electronic memory of the power conversion system, and
    change to a second mode with the rectifier on and the inverter on.

10. The power conversion system of claim 9, wherein the processor is operative in the first mode to store an adjusted amplifier gain value in the electronic memory.

11. The power conversion system of claim 10, wherein the processor is operative in the first mode to selectively identify a filter capacitor fault by:
measuring the filter voltages, amplifying the current sensor signals, and calculating the capacitance values an integer number N times, wherein N is greater than 1; and
identifying a filter capacitor fault if all the N calculated capacitance values are not within the acceptable tolerance range.

12. The power conversion system of claim 11, wherein the processor is operative in the second mode, with the rectifier on and the inverter on, to:
- measure the filter voltages;
- amplify the current sensor signals using the adjustable amplifier circuit;
- convert the amplified current signals using the analog to digital converter circuit;
- calculate capacitance values of the filter capacitors based at least partially on the amplified current signals and the measured filter voltages;
- determine whether the calculated capacitance values are within a second acceptable tolerance range; and
- if the calculated capacitance values are not within the second acceptable tolerance range, selectively identify a filter capacitor fault in the power conversion system.

13. The power conversion system of claim 12, wherein the second acceptable tolerance range is determined at least partially according to the base values stored in the electronic memory.

14. The power conversion system of claim 9, wherein the processor is operative in the first mode to selectively identify a filter capacitor fault by:
- measuring the filter voltages, amplifying the current sensor signals, and calculating the capacitance values an integer number N times, wherein N is greater than 1; and
- identifying a filter capacitor fault if all the N calculated capacitance values are not within the acceptable tolerance range.

15. The power conversion system of claim 14, wherein the processor is operative in the second mode, with the rectifier on and the inverter on, to:
- measure the filter voltages;
- amplify the current sensor signals using the adjustable amplifier circuit;
- convert the amplified current signals using the analog to digital converter circuit;
- calculate capacitance values of the filter capacitors based at least partially on the amplified current signals and the measured filter voltages;
- determine whether the calculated capacitance values are within a second acceptable tolerance range; and
- if the calculated capacitance values are not within the second acceptable tolerance range, selectively identify a filter capacitor fault in the power conversion system.

16. The power conversion system of claim 9, further comprising:
- a second amplifier circuit to amplify voltage sensor signals representing filter voltages associated with the filter circuit to generate amplified voltage signals; and
- a second analog to digital converter circuit to convert the amplified voltage signals;
- wherein the processor is operative, in the first mode, to automatically adjust a second amplifier gain of the second amplifier circuit according to a conversion range of the second analog to digital converter circuit based at least partially on the amplified voltage signals.

17. A non-transitory computer readable medium with computer executable instructions in a filter circuit of a power conversion system, the computer readable medium comprising computer executable instructions for:
- in a first mode with multiphase AC power provided to the filter circuit of the power conversion system:
  - measuring filter voltages associated with the filter circuit,
  - using an amplifier circuit, amplifying current sensor signals representing filter currents associated with the filter circuit to generate amplified current signals,
  - converting the amplified current signals using an analog to digital converter circuit,
  - automatically adjusting an amplifier gain of the amplifier circuit according to a conversion range of the analog to digital converter circuit based at least partially on the amplified current signals,
  - calculating capacitance values of filter capacitors of the filter circuit based at least partially on the amplified current signals and the measured filter voltages,
  - determining whether the calculated capacitance values are within an acceptable tolerance range,
  - if the calculated capacitance values are not within the acceptable tolerance range, selectively identifying a filter capacitor fault in the power conversion system, and
  - if the calculated capacitance values are within the acceptable tolerance range:
    - storing the calculated capacitance values as base values in an electronic memory of the power conversion system, and
    - changing to a second mode with the rectifier on and the inverter on.

* * * * *